United States Patent
Kim et al.

(10) Patent No.: US 8,429,485 B2
(45) Date of Patent: *Apr. 23, 2013

(54) METHOD AND APPARATUS FOR DETECTING FREE PAGE AND A METHOD AND APPARATUS FOR DECODING ERROR CORRECTION CODE USING THE METHOD AND APPARATUS FOR DETECTING FREE PAGE

(75) Inventors: Kwan-ho Kim, Suwon-si (KR); Jong-in Kim, Yongin-si (KR); Young-wook Jang, Yongin-si (KR); Hee-dong Shin, Seoul (KR); Bong-chun Kang, Ansan-si (KR); Jong-jin Lee, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 712 days.

This patent is subject to a terminal disclaimer.

(21) Appl. No.: 12/557,651

(22) Filed: Sep. 11, 2009

(65) Prior Publication Data
US 2010/0070821 A1    Mar. 18, 2010

(30) Foreign Application Priority Data
Sep. 12, 2008  (KR) .................. 10-2008-0090490

(51) Int. Cl.
*H03M 13/05* (2006.01)
*H03M 13/33* (2006.01)

(52) U.S. Cl.
USPC ........................................ 714/752; 714/718

(58) Field of Classification Search .................... None
See application file for complete search history.

(56) References Cited

U.S. PATENT DOCUMENTS

| | | | | |
|---|---|---|---|---|
| 5,996,041 A * | 11/1999 | Kim | ............................ | 711/103 |
| 6,266,790 B1 * | 7/2001 | Nimoda | ...................... | 714/704 |
| 7,437,653 B2 * | 10/2008 | Gorobets | ................... | 714/782 |
| 8,024,638 B2 * | 9/2011 | Resnick et al. | ............... | 714/758 |
| 2007/0061687 A1 * | 3/2007 | Hwang | ......................... | 714/780 |
| 2007/0280031 A1 * | 12/2007 | Maejima et al. | ......... | 365/230.06 |

FOREIGN PATENT DOCUMENTS

| | | |
|---|---|---|
| JP | 2004-234545 | 8/2004 |
| JP | 2001-092723 | 9/2009 |
| KR | 1020070099586 A | 10/2007 |

* cited by examiner

*Primary Examiner* — Ajay Bhatia
*Assistant Examiner* — Dipakkumar Gandhi
(74) *Attorney, Agent, or Firm* — F. Chau & Associates, LLC

(57) ABSTRACT

A method and apparatus for detecting a free page of a memory device, and a method and apparatus for decoding an error correction code by using the method and apparatus for detecting a free page are provided. Free page data read from the memory is converted into a converted codeword for inclusion as an element of an error correction code field. The converted codeword is compared to an initially set target codeword to detect an amount of non-identical bits. A page read from the memory is determined to be a free page when the amount of non-identical bits is equal to or less than an initially set threshold value.

13 Claims, 5 Drawing Sheets

METHOD AND APPARATUS FOR DETECTING FREE PAGE AND A METHOD AND APPARATUS FOR DECODING ERROR CORRECTION CODE USING THE METHOD AND APPARATUS FOR DETECTING FREE PAGE

CROSS-REFERENCE TO RELATED APPLICATION

This application claims priority to and the benefit of Korean Patent Application No. 10-2008-0090490, filed on Sep. 12, 2008, in the Korean Intellectual Property Office, the entire disclosure of which is incorporated by reference herein.

BACKGROUND

The present disclosure relates to a method and apparatus for processing data in a memory device, and more particularly, to a method and apparatus for detecting a free page of a memory device, and a method and apparatus for decoding an error correction code by using the method and apparatus for detecting a free page.

Generally, in a non-volatile memory device, a cell having a recorded '1', as a default status can be changed to a cell having a recorded '0' via a writing operation, but a cell having written '0' cannot be changed to a cell having written '1' via a writing operation. Accordingly, when data is written in a non-volatile memory device, a deleting operation is performed such that all bits in a block are reset, including the bits to write the data to have a recorded '1'. Areas that are simultaneously deleted via one deleting operation correspond to a block, and pages in a deleted block are called free pages.

Accordingly, a method of effectively determining whether a page read from a memory is a free page would be helpful for memory device operation.

SUMMARY

In accordance with an exemplary embodiment of the inventive concept a method of detecting a free page of memory is provided. Free page data read from the memory is converted into a converted codeword for inclusion as an element of an error correction code field. The converted codeword is compared to an initially set target codeword to detect an amount of non-identical bits. A page read from the memory is determined to be a free page when the amount of non-identical bits is equal to or less than an initially set threshold value.

The target codeword may be a codeword having all bits a logic value of 0.

Error correction code decoding may be performed when the amount of non-identical bits exceeds the initially set threshold value.

The amount of bits that are not identical may be reported as an amount of stuck bits when the page read from the memory is determined to be a free page.

In accordance with an exemplary embodiment of the inventive concept a method of detecting a free page is provided. Data read from a memory is inverted. The amount of bits of inverted data having a logic value of 1 in an initially set data size unit is detected. A page read from the memory is determined to be a free page when the amount of bits is equal to or less than an initially set threshold value.

Error correction code decoding may be stopped when the page read from the memory is determined to be a free page.

The amount of bits that have a logic value of 1 may be reported as an amount of stuck bits when the page read from the memory is a free page.

Error correction code decoding may be performed when the page read from the memory is not a free page.

In accordance with an exemplary embodiment of the inventive concept, a method of decoding an error correction code is provided. Data read from a memory is inverted. The number of bits of inverted data having a logic value of 1 in an initially set data size unit is detected and error detection on the inverted data is simultaneously performed on the inverted data based upon an error correction code; Error correction being performed according to the error correction code is stopped when a detected amount of bits that have a logic value of 1 is less than or equal to an initially set threshold value. Error correction according to the error correction code is performed when the amount of bits exceeds the initially set threshold value and an error is detected from the inverted data.

A determination may be made that a page read from the memory is a free page when the amount of bits is equal to or less than the initially set threshold value.

The amount of bits that have a logic value of 1 may be reported as an amount of stuck bits when the amount of bits is equal to or less than the initially set threshold value.

In accordance with an exemplary embodiment of the inventive concept a computer readable recording medium having recorded thereon a program may be provided that executes the above-described methods.

In accordance with an exemplary embodiment of the inventive concept an apparatus for detecting a free page includes an inverter that inverts data read from a memory, and a free page detector that detects an amount of bits having a logic value of 1 in an initially set data size unit from data output from the inverter, and that determines that a page read from the memory is a free page when the amount of bits is equal to or less than an initially set threshold value.

In accordance with an exemplary embodiment of the inventive concept an apparatus for decoding an error correction code is provided which includes a first inverter that inverts data read from a memory; a free page detector that detects an amount of bits having a logic value of 1 in an initially set data size unit from data output from the first inverter, and that generates a free page status signal when the amount of bits is equal to or less than an initially set threshold value, a data buffer that temporally stores the data read from the memory; a second inverter that inverts data read from the data buffer, and an error correction code decoder that detects an error based on an error correction code by inputting data output from the second inverter, that corrects a detected error and outputs a corrected error, and that, when the free page status signal is generated, stops detection and correction of the error.

In accordance with an exemplary embodiment of the inventive concept an apparatus for decoding an error correction code is provided which includes: a first inverter that inverts data read from a memory, a free page detector that detects an amount of bits having a logic value of 1 in an initially set data size unit from data output from the first inverter, and that generates a free page status signal when the amount of bits is less than or equal to an initially set threshold value, and an error correction code decoder that detects an error based on an error correction code by inputting data output from the first inverter, that stops correcting the error when the free page status signal is generated, and that corrects the error when the free page status signal is not generated.

In the exemplary embodiments the initially set data size may be set to the size of a codeword.

In the exemplary embodiments the error correction code decoding may be stopped when the page read from the memory is determined to be a free page.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

First, exemplary embodiments of a memory device in accordance with the inventive concept will be described.

Figure 1:
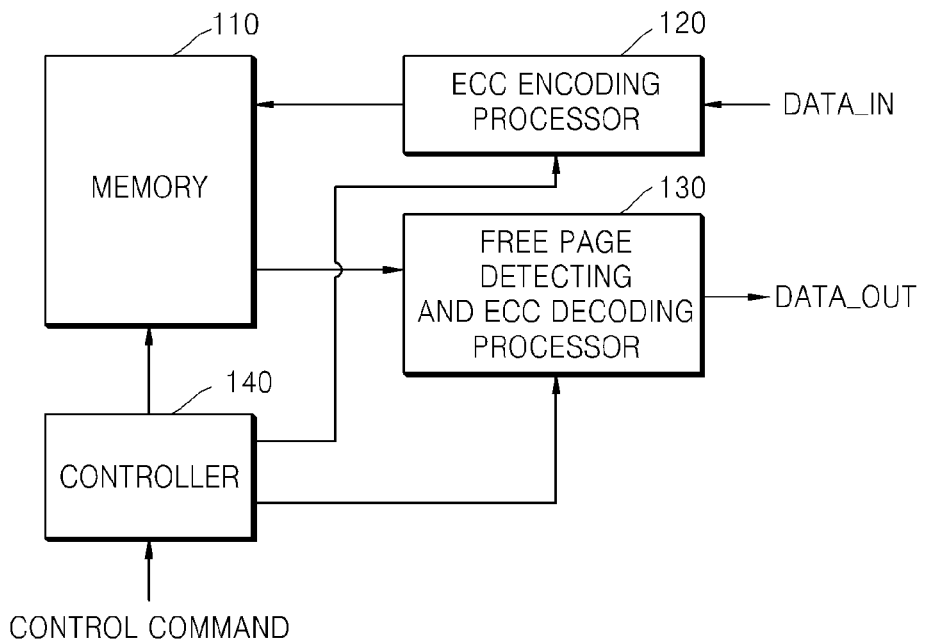
FIG. 1 is a block diagram of a memory device according to an exemplary embodiment of the inventive concept.

As shown in FIG. 1, the memory device includes a memory 110, an ECC encoding processor 120, a free page detecting and ECC decoding processor 130, and a controller 140.

The memory 110 stores information and includes a non-volatile memory device. The memory 110 may be a flash memory.

In a flash memory as a non-volatile memory device, a cell having a written 1 as a default status can be converted into a cell having a written 0 via a writing operation, but a cell that has a written 0 cannot be converted into a cell having a written 1 via a writing operation. Accordingly, when data is to be written in the flash memory, all bits in a block including the bits to write the data are reset to have logic value of 1. A page where all bits are reset to have logic value of 1 is called a free page.

A free page of a flash memory can have an error bit generated via a writing operation on a related page, such as in a pair page of a multi level cell (MCL). A block of a free page having an error bit may be discarded by performing a runtime bad block on the block, but usable memory capacity decreases by doing so. An approach to address the error bit situation will be described in more detail below.

Due to physical characteristics of non-volatile memory, an error may be generated by the number of bits within a standard range while writing and reading data. Accordingly, the error may be corrected by using an ECC.

Accordingly, the ECC encoding processor 120 generates parity bits required while correcting an error with respect to received data DATA_IN, and outputs a codeword wherein the generated parity bits are added to the received data DATA_IN.

The codeword output from the ECC encoding processor 120 is written in the memory 110 by a read/write control signal and an address signal generated according to a control command transmitted by the controller 140.

When a control command directing a reading operation is received by the controller 140, the controller 140 reads data from the memory 110, and outputs the data to the free page detecting and ECC decoding processor 130.

The free page detecting and ECC decoding processor 130 performs a function of determining whether the data read form the memory 110 is free page data, and a function of ECC decoding processing based on the result of the determination.

Figure 4:
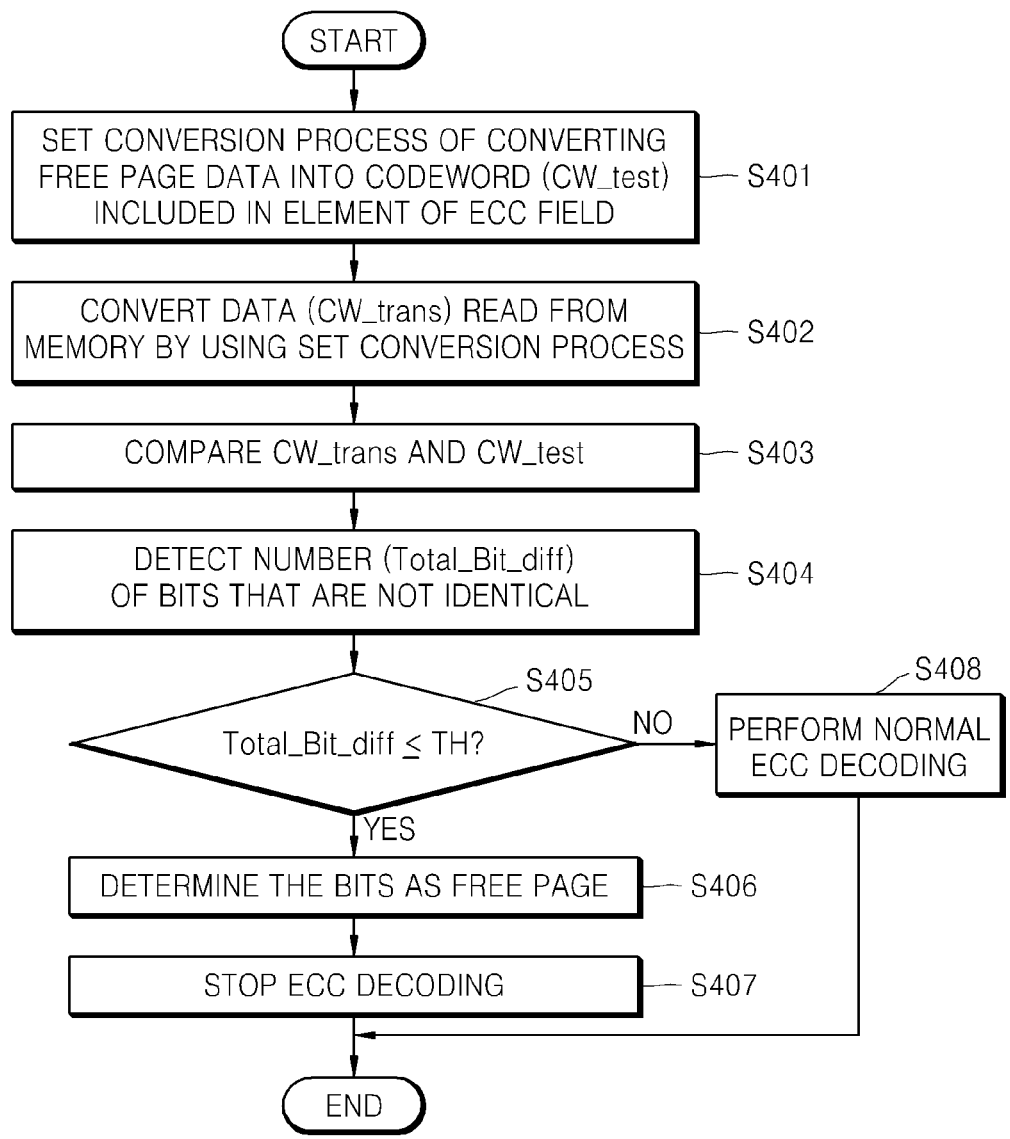
FIG. 4 is a flowchart illustrating a method of detecting a free page, according to an exemplary embodiment of the inventive concept.

The free page detecting and ECC decoding processor 130 performs free page detection and ECC decoding as shown in a flowchart illustrated in FIG. 4.

A method of detecting a free page will now be described with reference to FIG. 4.

First, a conversion process of converting free page data into a predetermined codeword CW_test to be included as an element of an ECC field is set in operation S401. In other words, a process of converting free page data to be mapped to a codeword that can be error-correction processed in an ECC field is performed. For reference, a codeword having all bits having a logic value of 0 is included as an element of an ECC field. Accordingly, for example, to detect a free page, a conversion process of converting free page data having all bits having a logic value of 1 into a codeword having all bits having a logic value of 0 may be selected.

Then, data that is read from the memory 110 is converted by using the conversion process set in operation S401 in operation S402. In other words, the data read from the memory 110 is converted into a codeword CW_trans by using a mapping process that converts free page data into a codeword CW_test included as an element of ECC field as the one including the predetermined codeword CW_test.

The codeword CW_trans converted in operation S402 and the codeword CW_test set in operation S401 are compared bit by bit in operation S403.

Based on the result of operation S403, a number Total_Bit_diff, that is, the total number of bits that are not identical is detected in operation S404.

Then, it is determined whether the number Total_Bit_diff detected in operation S404 is equal to or less than a threshold value TH in operation S405. Here, the threshold value TH is an initially set value, and is set within an error correctable range of the ECC decoder according to an exemplary embodiment of the inventive concept.

When it is determined that the number Total_Bit_diff is less than or equal to the threshold value TH in operation S405, a page read from the memory 110 is determined as a free page and ECC decoding is stopped respectively in operations S406 and S407.

When it is determined that the number Total_Bit_diff exceeds the threshold value TH in operation S405, normal ECC decoding is performed in operation S408.

As such, when the number of error bits in a free page is within an allowable range, the page read from the memory 110 is determined to be a free page, and when the page read from the memory 110 is determined to be a free page, ECC decoding is not required to be performed on free page data, and thus the ECC decoding is stopped.

Figure 2:
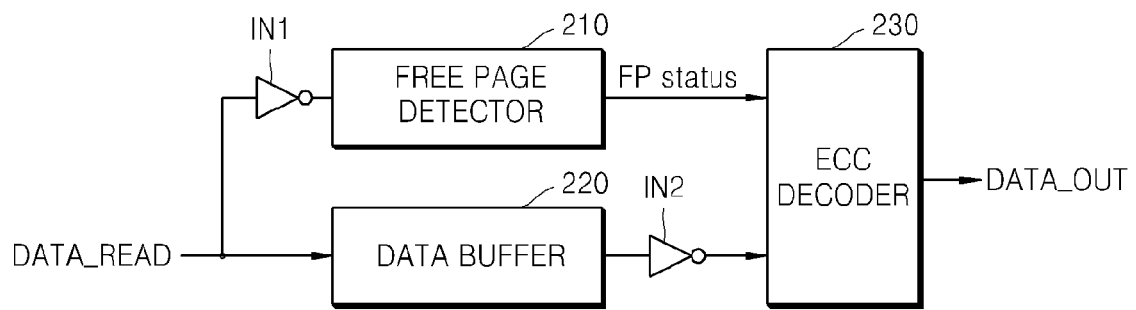
FIG. 2 is a diagram of an apparatus for decoding an error correction code (ECC), according to an exemplary embodiment of the inventive concept.
Figure 3:
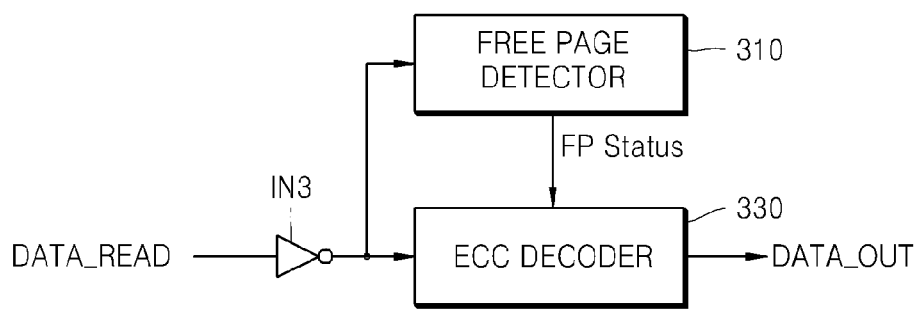
FIG. 3 is a diagram of an apparatus for decoding an ECC, according to an exemplary embodiment of the inventive concept.

When the conversion process of converting free page data having all bits having a logic value of 1 into a codeword having all bits having a logic value of 0 is used to detect a free page, a detailed structure of the free page detecting and ECC decoding processor 130 may be as shown in FIGS. 2 and 3.

For reference, the free page detecting and ECC decoding processor 130 is also referred to as an apparatus for decoding ECC.

As shown in FIG. 2, an apparatus for decoding ECC according to an exemplary embodiment of the inventive concept includes a plurality of inverters IN1, IN2, a free page detector 210, a data buffer 220, and an ECC decoder 230.

The inverter IN1 inverts data DATA_READ read from the memory 110, and then outputs the inverted data DATA_READ to the free page detector 210.

The free page detector 210 detects the number of bits having a logic value of 1 in an initially set data size unit from the data output from the inverter IN1, and generates a free page status signal FP status when the detected number of the bits having a logic value of 1 is equal to or less than an initially set threshold value TH.

The data buffer 220 temporarily stores the data DATA_READ read from the memory 110, and sequentially outputs the stored data after detecting a free page.

The inverter IN2 inverts the data output from the data buffer 220, and outputs the inverted data to the ECC decoder 230.

The ECC decoder 230 receives the data output from the inverter IN2, detects an error in the received data based on an ECC, corrects the detected error and outputs the corrected error, and stops detecting and correcting an error when a free page status signal FP status is generated.

Figure 5:
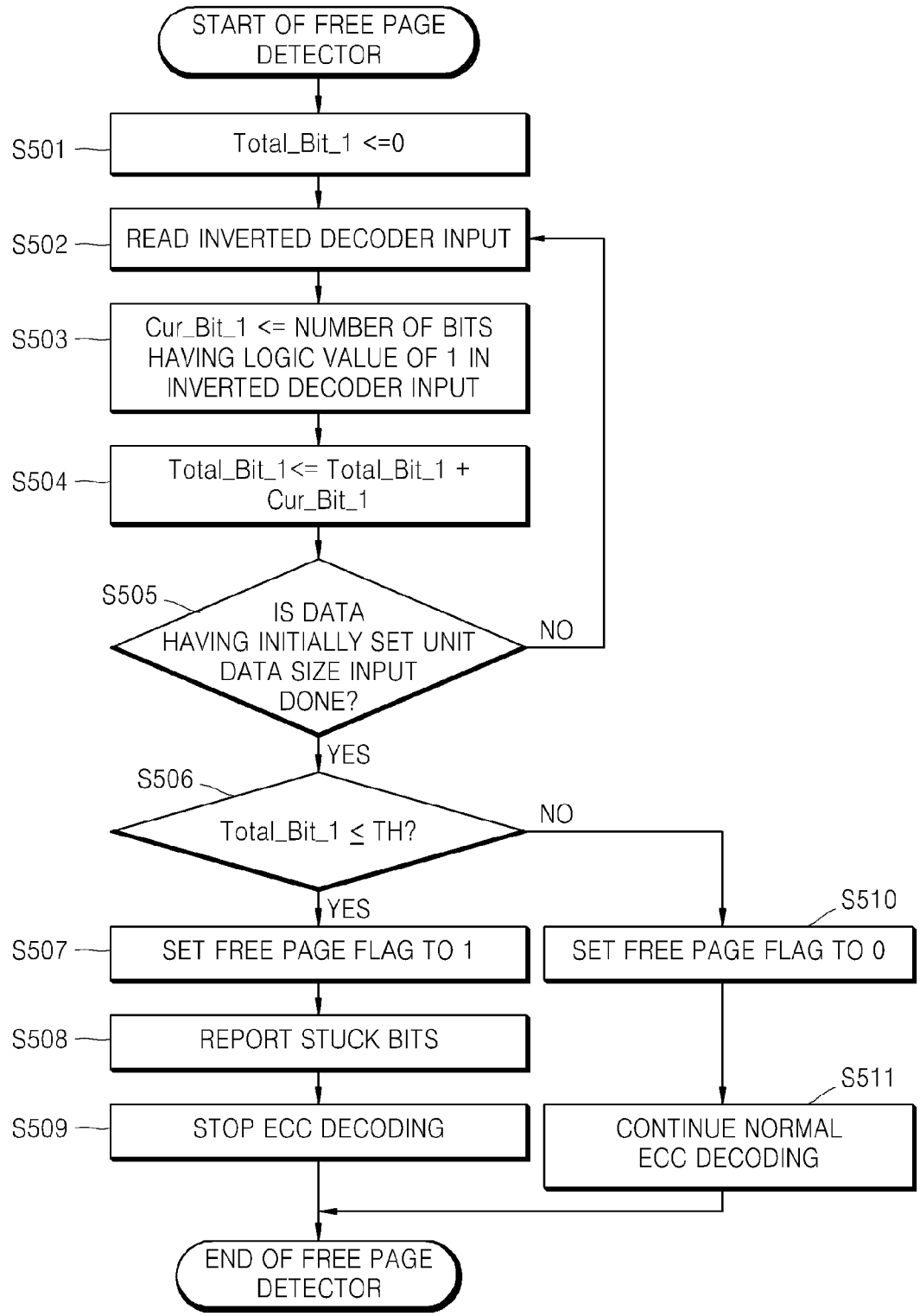
FIG. 5 is a flowchart illustrating a method of detecting a free page, according to an exemplary embodiment of the inventive concept.

In more detail, the free page detector 210 and the ECC decoder 230 respectively detect a free page and perform ECC decoding based on the result of the detection, according to a method illustrated in FIG. 5. Operations of detecting a free page and performing ECC decoding will now be described with reference to FIG. 5.

First, a number Total_Bit_1, that is, a value stored in a register installed in the free page detector 210, is reset to 0 in operation S501.

Then, the free page detector 210 reads an inverted decoder input in operation S502. The inverted decoder input corresponds to data output from the inverter IN1.

Figure 7:
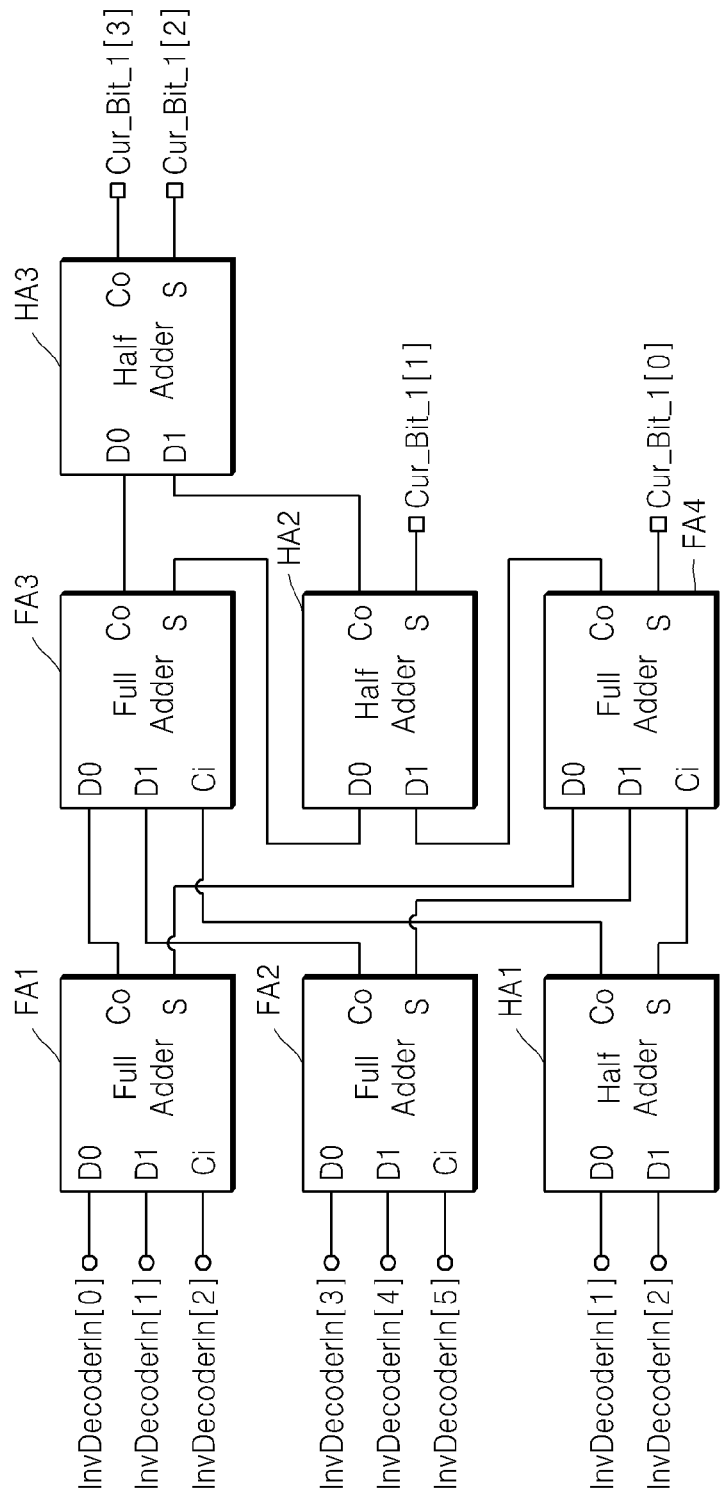
FIG. 7 is a diagram illustrating a logic circuit for counting the number of bits having a logic value of 1 from an inverted decoder input, according to an exemplary embodiment of the inventive concept.

The number of bits having a logic value of 1 is counted from the inverted decoder input transmitted to the apparatus for decoding ECC for one cycle, and then outputs the counted number as a number Cur_Bit_1 in operation S503. FIG. 7 is a diagram illustrating a logic circuit for counting the number of bits having a logic value of 1 from the inverted decoder input when data to be processed by the ECC decoder 230 in each cycle is 8 bits.

As illustrated in FIG. 7, the number Cur_Bit_1 of bits having a logic value of 1 from the inverted decoder input may be detected for one cycle by combining 4 full adders FA1 through FA4 and 3 half adders HA1 through HA3. When data to be processed each cycle exceeds 8 bits, a logic circuit may be designed by using a plurality of the logic circuits of FIG. 7 and a binary adder. When the data to be processed is less than 8 bits, unused bits may be set to have a logic value of 0.

Then, the number Total_Bit_1 is updated and stored by adding the number Total_Bit_1 and the number Cur_Bit_1 of operation S503 in operation S504.

After operation S504, it is determined whether inputting data having an initially set unit data size to the apparatus is done in operation S505. Here, the initially set unit data size may be the size of a codeword.

When it is determined that the inputting of the data having the initially set unit data size is not done in operation S505, operation S502 is performed for a next cycle.

When it is determined that the inputting of the data having the initially set unit data size is done in operation S505, the stored number Total_Bit_1 is compared to a threshold value TH in operation S506.

When it is determined that the number Total_Bit_1 is equal to or less than the threshold value TH, a free page flag is set to having a logic value of 1 to determine that a free page status is detected in operation S507.

After setting the free page flag to 1, the value of Total_Bit_1 is reported as the number of stuck bits in operation S508. The stuck bits are bits having a hard error in a free page.

Then, ECC decoding is stopped in operation S509. In other words, when the free page flag is set to 1, the ECC decoder 230 stops detecting and correcting an error.

When it is determined that the number Total_Bit_1 exceeds the threshold value TH, the free page flag is set to have logic value of 0 to determine that the free page status is not detected in operation S510.

When the free page flag is set to 0, the ECC decoder 230 performs normal error detection and correction in operation S511.

According to the method of FIG. 5, ECC decoding is held back while determining a free page status, and when the free page status is determined, the ECC decoding is stopped, and when the free page status is not determined, the ECC decoding is normally performed.

FIG. 3 is a diagram of an apparatus for decoding an ECC, according to an exemplary embodiment of the inventive concept. The apparatus illustrated in FIG. 2 is performs ECC decoding after detecting a free page, whereas the apparatus illustrated in FIG. 3 simultaneously detects a free page and performs ECC decoding.

Referring to FIG. 3, the apparatus includes an inverter IN3, a free page detector 310, and an ECC decoder 330.

The inverter IN3 inverts data DATA_READ read from the memory 110, and simultaneously outputs the inverted data to the free page detector 310 and the ECC decoder 330.

The free page detector 310 detects the number of bits having a logic value of 1 in an initially set data size unit from the data output from the IN3, and generates a free page status signal FP Status when the number of the bits is equal to or less than an initially set threshold value TH.

The ECC decoder 330 receives the data output from the inverter IN3, detects an error in the received data based on an ECC, stops error correction when a free page status signal FP Status is generated, and normally performs error correction when a free page status signal FP Status is not generated.

In other words, the ECC decoder 330 detects an error and the free page detector 310 detects a free page, simultaneously. When the free page detector 310 determines a free page, the ECC decoder 330 stops the error correction. Also, when the free page detector 310 does not determine a free page, the ECC decoder 330 normally performs the error correction.

Figure 6:
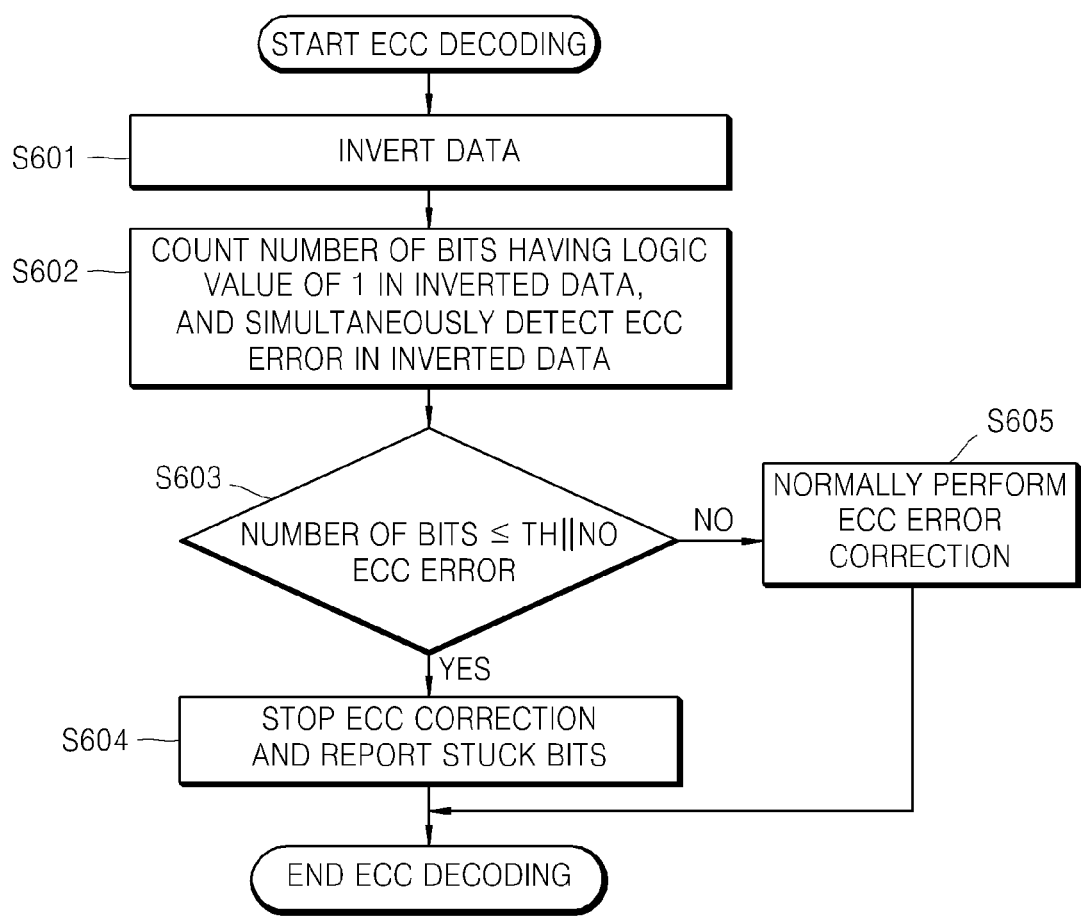
FIG. 6 is a flowchart illustrating a method of detecting a free page, according to an exemplary embodiment of the inventive concept.

A method of detecting a free page and performing ECC decoding according to the structure of FIG. 3 will now be described with reference to FIG. 6.

First, data DATA_READ that is read from the memory 110 and input to the apparatus is inverted in operation S601.

Then, the number of bits having a logic value of 1 included in a unit data size is counted from the inverted data, and an ECC error is simultaneously detected from the inverted data in operation S602. Here, the unit data size may be the size of a codeword.

After counting the number of the bits having a logic value of 1 and detecting an ECC error, it is determined whether the number of the bits is equal to or less than a threshold value TH and whether the ECC error is detected in operation S603.

When it is determined that the number of the bits is equal to or less than the threshold value TH or that an ECC error is not detected in operation S603, error correction based on an ECC is stopped, and the number of the bits is reported as the number of stuck bits in operation S604.

When it is determined that the number of the bits exceeds the threshold value TH, and an ECC error is detected, ECC error correction is normally performed in operation S605.

Accordingly, a free page is detected and an ECC error is detected, simultaneously, and the ECC error correction is performed based on the result of detecting the free page and the ECC error.

The embodiments of the inventive concept can be implemented as a method, an apparatus, and a system. When the embodiments are implemented in software, its component elements are code segments that execute necessary operations. Programs or code segments can be stored in processor readable media. The processor readable medium can be any medium that can store or transmit data.

While the inventive concept has been particularly shown and described with reference to exemplary embodiments thereof, it will be understood that various changes in form and details may be made therein without departing from the spirit and scope of the following claims.

What is claimed is:

1. A method of detecting a free page of memory, the method comprising:
   converting free page data read from the memory into a converted codeword for inclusion as an element of an error correction code field;
   comparing the converted codeword to an initially set target codeword to detect an amount of non-identical bits; and
   determining before error correction code decoding is performed that a page read from the memory is a free page when the amount of non-identical bits is equal to or less than an initially set threshold value.

2. The method of claim 1, wherein the target codeword comprises a codeword having all bits a logic value of 0.

3. The method of claim 1, further comprising performing error correction code decoding when the amount of non-identical bits exceeds the initially set threshold value.

4. The method of claim 1, further comprising reporting the amount of bits that are not identical as an amount of stuck bits when the page read from the memory is determined to be a free page.

5. A non-transitory computer readable recording medium having recorded thereon a program that executes the method of claim 1.

6. A method of detecting a free page, the method comprising:
   inverting data read from a memory;
   detecting an amount of bits of inverted data having a logic value of 1 in an initially set data size unit; and
   determining before error correction code decoding is performed that a page read from the memory is a free page when the amount of bits is equal to or less than an initially set threshold value.

7. The method of claim 6, wherein the initially set data size is set to the size of a codeword.

8. The method of claim 6, further comprising reporting the amount of bits that have a logic value of 1 as an amount of stuck bits when the page read from the memory is a free page.

9. The method of claim 6, further comprising performing error correction code decoding when the page read from the memory is not a free page.

10. An apparatus for detecting a free page, the apparatus comprising: an inverter that inverts data read from a memory; and
   a free page detector that detects an amount of bits having a logic value of 1 in an initially set data size unit from data output from the inverter, and that determines before error correction code decoding is performed that a page read from the memory is a free page when the amount of bits is equal to or less than an initially set threshold value.

11. The apparatus of claim 10, wherein the initially set data size is set as the size of a codeword.

12. An apparatus for decoding an error correction code, the apparatus comprising:
   a first inverter that inverts data read from a memory;
   a free page detector that detects before error correction coding is performed an amount of bits having a logic value of 1 in an initially set data size unit from data output from the first inverter, and that generates a free page status signal when the amount of bits is equal to or less than an initially set threshold value;
   a data buffer that temporally stores the data read from the memory;
   a second inverter that inverts data read from the data buffer; and
   an error correction code decoder that detects an error based on an error correction code by inputting data output from the second inverter, that corrects a detected error and outputs a corrected error, and that, when the free page status signal is generated, stops detection and correction of the error.

13. An apparatus for decoding an error correction code, the apparatus comprising:
   a first inverter configured to invert 8-bit data read from a memory;
   a free page detector configured to detect an amount of bits having a logic value of 1 in an initially set data size unit from data output from the first inverter, and that generates a free page status signal when the amount of bits is less than or equal to an initially set threshold value; and
   an error correction code decoder configured to detect an error based on an error correction code by inputting data output from the first inverter, to stop correcting the error when the free page status signal is generated, and to correct the error when the free page status signal is not generated,
   wherein the free page detector comprises a logic circuit configured to count the amount of bits having a logic value 1 and output a counted number, the logic circuit comprising:
   a first full adder responsive to a first three bits of inverted 8-bit data;
   a second full adder responsive to a second three bits of inverted 8-bit data;
   a first half adder responsive to a last two bits of inverted 8-bit data;
   a third full adder responsive to a carry of each of the first full adder, the second full adder and the first half adder;
   a fourth full adder responsive to a sum of each of the first full adder, the second full adder and the first half adder;
   a second half adder responsive to a sum of each of the third full adder and the fourth full adder, and
   a third half adder responsive to a carry of each of the third full adder and the second half adder.

* * * * *